United States Patent [19]
Gilbert et al.

[11] Patent Number: 5,684,431
[45] Date of Patent: Nov. 4, 1997

[54] DIFFERENTIAL-INPUT SINGLE-SUPPLY VARIABLE GAIN AMPLIFIER HAVING LINEAR-IN-DB GAIN CONTROL

[75] Inventors: Barrie Gilbert; Eberhard Brunner, both of Portland, Oreg.

[73] Assignee: Analog Devices

[21] Appl. No.: 571,735

[22] Filed: Dec. 13, 1995

[51] Int. Cl.$^6$ .................................................. H03G 3/30
[52] U.S. Cl. ......................... 330/254; 330/260; 330/284
[58] Field of Search ........................... 330/85, 144, 145, 330/254, 260, 284

[56] References Cited

U.S. PATENT DOCUMENTS

| | | | |
|---|---|---|---|
| 3,539,831 | 11/1970 | Gilbert | 307/235 |
| 4,476,538 | 10/1984 | Gilbert | 364/817 |
| 5,077,541 | 12/1991 | Gilbert | 330/284 |
| 5,285,169 | 2/1994 | Theus | 330/254 |
| 5,432,478 | 7/1995 | Gilbert | 330/284 |

FOREIGN PATENT DOCUMENTS

| | | | |
|---|---|---|---|
| 11511 | 1/1982 | Japan | 330/284 |

OTHER PUBLICATIONS

Brunner, Eberhard, Wescon/95, Conference Record, Moscone Convention Center, San Francisco, California, Nov. 7–9, 1995, *An Ultra–Low Noise Linear–in–dB Variable Gain Amplifier for Medical Ultrasound Applications*, pp. 650–655.

"Analogue IC design: the current–mode approach," Chapter 2 entitled Current–mode Circuits From A Translinear Viewpoint: A Tutorial by Barrie Gilbert, Peter Peregrinus Ltd., pp. 10–91, 1990.

"Trig Function Generator" by Analog Devices, Inc., A remarkable monolithic microsystem generates trigonometric function by Barrie Gilbert, McGraw–Hill, Inc., 1984.

"High Speed, Video Difference Amplifier" by Analog Devices, Oct. 1992.

"A Monolithic Microsystem for Analog Synthesis of Trigonometric Functions and Their Inverses" by Barrie Gilbert, IEEE Journal of Solid–State Circuits, vol. SC–17, No. 6, pp. 1179–1191, Dec. 1982.

"The Active Feedback Amplifier —A Versatile Analog Building Block" by Eberhard Brunner and Barrie Gilbert, Northcon/94, Conference Record, pp. 131–136, Oct. 1994.

"Analog IC design: the current–mode approach," Chapter 6 entitled Bipolar Current Mirrors by Barrie Gilbert, IEE Circuits and Systems Series 2, pp. 239–296, date of publication 1990.

*Primary Examiner*—James B. Mullins
*Attorney, Agent, or Firm*—Marger, Johnson, McCollom & Stolowitz

[57] ABSTRACT

A variable gain amplifier uses a differential attenuator to provide a differential input to which a differential input signal is applied. The differential attenuator is comprised of (N−1) π attenuator stages, with each stage forming a pair of attenuator taps for providing an attenuated version of the differential input signal. The differential input forms a high-impedance input, which is essentially floating. Each pair of taps is coupled to the differential inputs of a respective gm stage. The differential outputs of the gm stages are coupled to the differential inputs of a main amplifier, which has a high open-loop gain. The transconductance of each gm stage is controlled by an interpolator which provides a bias current to each of the gm stages in a sequential manner as a gain control voltage is swept from its minimum to its maximum values. The combination of the attenuated input voltage, the varying transconductances produces a gain response that is linear-in-dB relative to the gain control voltage. The output of the main amp is fed back through a gain-setting resistor network through a fixed gm stage.

20 Claims, 8 Drawing Sheets

DIFFERENTIAL-INPUT SINGLE-SUPPLY VARIABLE GAIN AMPLIFIER HAVING LINEAR-IN-DB GAIN CONTROL

BACKGROUND OF THE INVENTION

This invention relates generally to variable-gain amplifiers and more particularly to such amplifiers where the gain can be varied exactly exponentially by an analog control signal.

Variable-gain amplifiers have been used for many years, and a wide variety of techniques have been employed for control of their gain. This subject is so central to the topic of signal processing that the literature is too extensive to summarize with any brevity. However, it does appear that one common theme is used in many analog variable-gain techniques—employment of non-linear circuit elements directly in the signal path, e.g., the exponential relationship between collector current and base-emitter voltage in a bipolar junction transistor.

Examples of this approach can be found in U.S. Pat. No. 5,077,541, entitled "Variable Gain Amplifier Controlled by an Analog Signal and Having a Large Dynamic Range," and No. 5,432,478, entitled "Linear Interpolation Circuit," both by one of the present applicants. The variable-gain amplifiers shown and discussed in those two patents can be represented by the block diagram shown in FIG. 1. The variable-gain amplifier of FIG. 1 includes four main components: an interpolator 12, an attenuator network 14, a series of transconductance (gm) stages 16, and a main amplifier 18. The variable-gain amplifier, shown generally at 10, also includes a gain setting feedback attenuator comprised of resistors R1 and R2. A third resistor R0 is shown coupled between an internal bonding pad and a system ground (SYSTEM GROUND). This resistor R0 represents the resistance due to a bond wire within an integrated circuit package, as well as other parasitic resistances.

The variable-gain amplifier 10 includes a single input terminal INP to which an input voltage $V_{IN}$ is applied. This input voltage is referenced to the system ground, as shown in FIG. 1. The amplifier 10 similarly includes an output terminal for providing an output voltage $V_{OUT}$ that is also referenced to system ground. Thus, the input and output voltages are both single ended.

The amplifier 10 also includes a pair of input terminals GNP and GNM across which a gain-control voltage $V_G$ is applied. This gain-control voltage $V_G$ is provided to the interpolator 12 which steers a control current $I_E$ to each of the gm stages in sequence as the gain-control voltage $V_G$ is varied between its minimum and maximum values. The control current activates each gm stage in sequence, raising the transconductance of each from effectively zero to a maximum and back to zero, in an overlapping fashion, so as to smoothly vary the overall gain of the variable amplifier as the control voltage $V_G$ is swept through its control range.

The attenuator 14 includes a plurality (N) of taps for providing a progressively attenuated version of the input voltage $V_{IN}$. Each of these taps is in turn connected to a non-inverting input of a respective gm stage. A common feedback voltage is coupled to the inverting inputs of all of the gm stages. A more detailed illustration is shown in FIG. 2 wherein the variable-gain amplifier of the No. 5,077,541 patent is reproduced. As is shown in FIG. 2, the attenuator network 14 includes N−1 R-2R attenuator stages. Each of these prior art stages are referred to herein as a "T" attenuator stage.

The variable-gain amplifier of FIG. 2 produces accurately-calibrated linear-in-dB gain-control, low noise yet good large signal-handling capability, and low distortion. This topology, however, has several limitations. First, the input resistance is typically only 100 ohms. This low resistance was necessary to achieve a low voltage-noise spectral density (VNSD), but it poses problems in some applications. Second, the use of an asymmetric ladder network, and a "classic op-amp" feedback technique, together result in the need for a very low resistance in the ground connection (less than 0.2 ohms) if gain errors are to be avoided. This requires the use of multiple bond wires. Third, the input signal must be single-sided, and referenced to the same ground as the output signal. Fourth, dual voltage supplies are required. Fifth, there is a large output offset voltage due to the high close-loop gain of the fixed amplifier. Sixth, there is a large offset ripple at the output as the gain is varied, due largely to the periodically varying base currents in the ladder attenuator. This offset variation with gain is troublesome in some applications, where a fast-ramping gain-control voltage can generate spurious signals at a much higher frequency. Seventh, the law-conformance of the gain error (i.e., the "gain ripple") varies over temperature. If the interpolator is designed to have low gain ripple at 27° C., it will have very pronounced ripple at low temperatures, while exhibiting higher errors at the extremities of the gain range at high temperatures. Finally, there is a small, periodic variation in non-linear distortion over the gain range.

Accordingly, a need remains for a variable-gain amplifier topology that does not suffer from the limitations of the prior art.

SUMMARY OF THE INVENTION

It is, therefore, an object of the invention to overcome these limitations of prior art variable-gain amplifiers.

The variable-gain amplifier according to the invention uses an active feedback amplifier (AFA) approach. In the AFA, two similar, differential input gm stages are used to realize a closed-loop amplifier. The AFA provides a differential high-impedance input and allows the separation of input and output grounds. The variable-gain amplifier according to the invention accomplishes this by providing a differential attenuator that is comprised of N−1 "π" attenuator stages (where N is equal to the number of gm stages) thus forming a fully-symmetric "π" network. In addition, the feedback is not returned to all of the gm stages, but rather to a separate, independent gm stage, one of the two of the AFA. This allows the use of both signal terminals of the input gm stages, thus providing a fully differential input capability. A high common-mode rejection ratio (CMRR) is maintained from DC up to high frequencies by careful design of the amplifier. Moreover, using PNP transistors, the common mode range can be extended right down to ground (more generally, to a negative supply), adding significantly to the utility of the amplifier.

In another aspect of the invention, a two-quadrant multiplier is provided to convert the temperature-stable gain-control voltage $V_G$ to a voltage proportional to $V_G$, but which is also proportional to absolute temperature (PTAT), that in turn drives the interpolator network with a variable PTAT voltage. This allows for a lower signal drive on the input voltage to the interpolator over the entire temperature range thereby allowing the variable gain amplifier to operate on a single supply voltage.

In yet another aspect of the invention, a power enable cell is provided which effectively shuts down the variable-gain amplifier when the gain-control voltage $V_G$ is less than a predetermined threshold.

An advantage of the invention is the fully differential input.

Another advantage of the invention is the elimination of errors due to the common impedance in the input attenuator network.

A further advantage is the accuracy and temperature insensitivity of the gain conformance of the amplifier.

A yet further advantage of the amplifier according to the invention is that the circuit can operate from a single supply.

Another advantage is the ability to place the circuit in a low power state.

The foregoing and other objects, features and advantages of the invention will become more readily apparent from the following detailed description of a preferred embodiment of the invention which proceeds with reference to the accompanying drawings.

DETAILED DESCRIPTION

Figure 1:
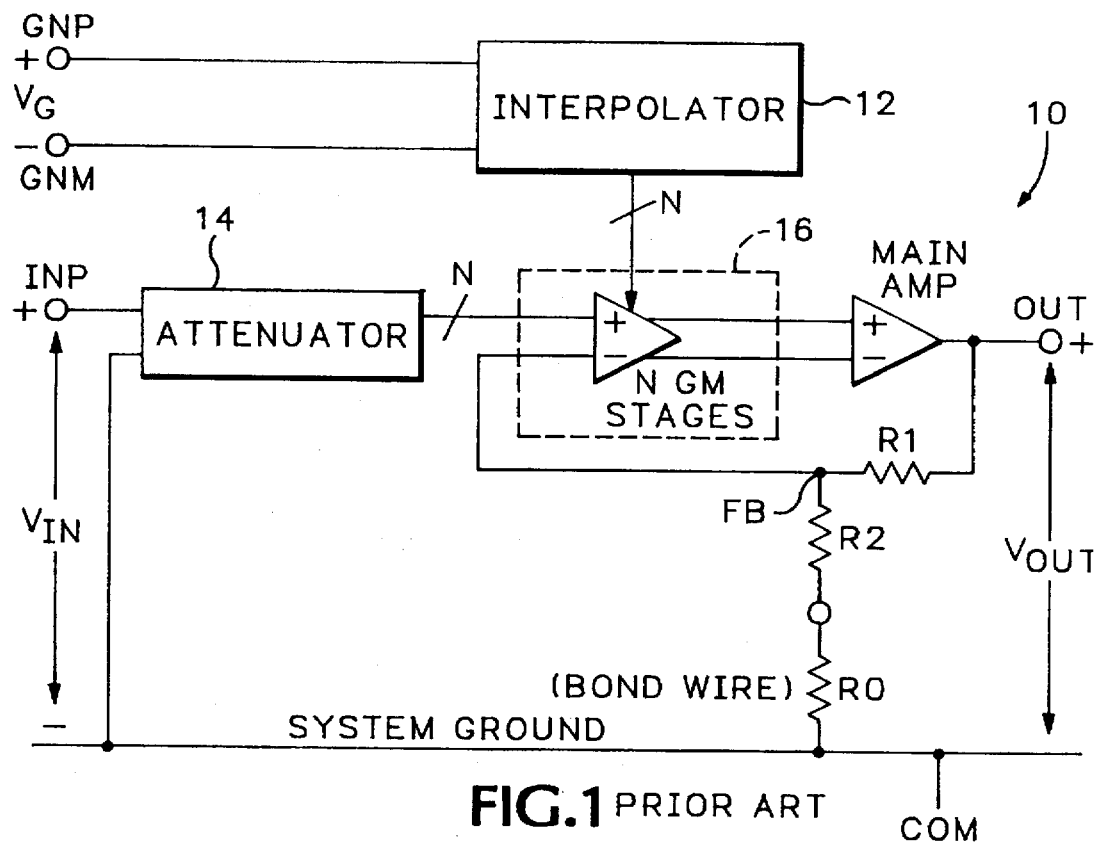
FIG. 1 is a block diagram of a prior art variable-gain amplifier using an OPA topology.
Figure 3:
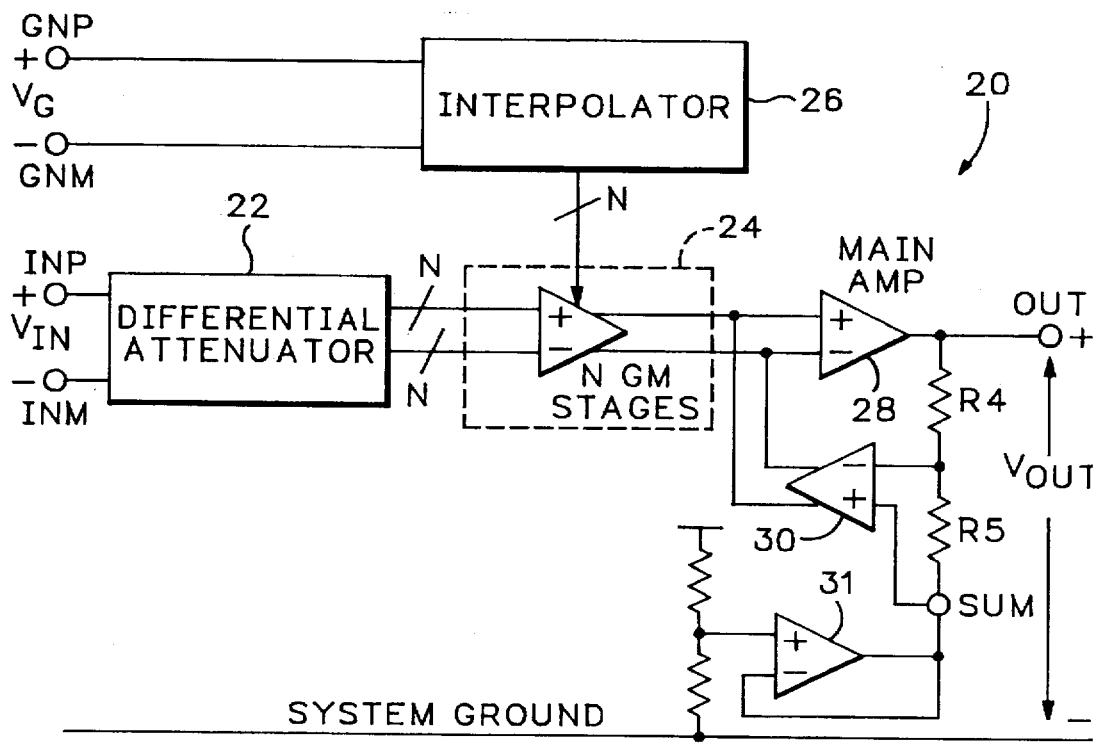
FIG. 3 is a block diagram of a variable-gain amplifier according to the invention.
Figure 2:
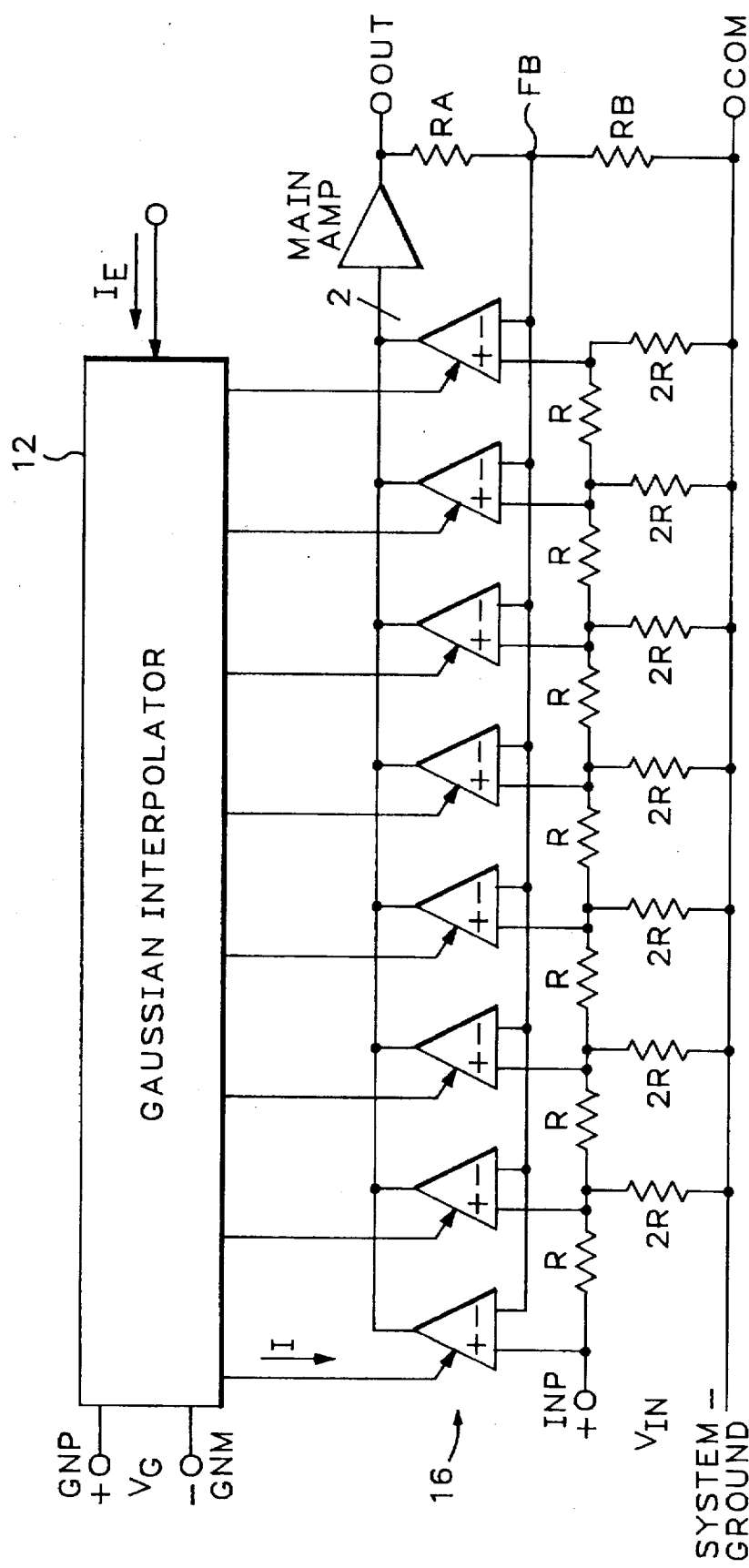
FIG. 2 is a more detailed block diagram of the prior art variable-gain amplifier as shown in FIG. 1.

Referring now to FIG. 3, a variable-gain amplifier is shown generally at 20. The first distinguishing aspect of amplifier 20 over prior variable-gain amplifiers is the fully differential signal inputs comprised of input terminals INP and INM. A fully differential input voltage $V_{IN}$ can then be applied across these two terminals. The input impedance, as seen as this interface, is between 200Ω to 1 kΩ, which is essentially floating, depending on the design of the attenuator. This is in contrast to the relatively low impedance (e.g., 100Ω) of the single-sided signal input of the prior art variable-gain amplifiers discussed above.

The differential signal input terminals INP and INM are coupled to a differential attenuator 22. The differential attenuator is described in more detail below. It can be seen from FIG. 3, however, that the differential attenuator 22 has N pairs of outputs. Each pair of differential attenuator outputs is coupled to the differential inputs of a respective gm stage in a gm block 24. For each pair of outputs, one of the pair is connected directly to a non-inverting input (+) of the respective gm stage and the other connected directly to the inverting input (−) of the same stage. The differential outputs of each gm stage are coupled to the differential input of the main amp 28.

As in the prior art, the variable-gain amplifier 20 includes a differential gain-control interface comprised of input terminals GNP and GNM, across which a gain-control voltage $V_G$ is applied. These gain-control inputs are coupled to an interpolator 26, which can be either a linear or Gaussian interpolator as shown and described in the above-cited U.S. patents. The interpolator 26, as is known in the art, includes N outputs with each output coupled to a respective gm stage for providing a bias current to each of the gm stages responsive to the gain-control voltage $V_G$. This will become more apparent in the discussion that follows with reference to FIGS. 4 and 5.

The amplifier 20 includes a main amplifier 28, which has a very high open loop gain (i.e., $A_{OL} \rightarrow \infty$). The main amplifier 28 includes a differential input coupled to the differential outputs of all of the N gm stages of 24.

The variable-gain amplifier 20 includes a feedback network comprised of resistors R4 and R5. Another apparent difference between the topology shown in FIG. 3 and that of the prior art is that the feedback is not returned to all of the gm stages, but rather to a separate, independent gm stage 30, as in an active-feedback-amplifier (AFA). This allows the use of both signal terminals of the input gm stages 24, thus providing a fully differential input capability, a valuable new feature. Configured in this way, the closed-loop gain is proportional to the ratio of the input gms (which vary as they are sequentially enabled by the interpolator 26) to the fixed gm of the feedback stage 30. This need not directly impact gain accuracy since analog circuits routinely depend on matching and ratios between like elements in monolithic circuits, but it does require more careful attention to details of the implementation. For example, all of the gm stages in a practical embodiment are somewhat dependent on the common-mode level at their inputs, so there now is a mechanism for a gain-dependence on the common-mode signal in those applications where the differencing capability is invoked. The significantly altered topology also affects the distortion since the signals are no longer nulled by the gm stages, as in the prior art, but must be fully supported by them. Here, however, the principle of non-linearity-cancellation is crucial.

The variable-gain amplifier according to the invention uses a feedback stage and a gain setting attenuator to make a complete active-feedback amplifier (AFA). The key point to understand here is that the gm nonlinearity (hyperbolic tangent function) of the simple bipolar differential pair used in the feedback stage cancels the nonlinearities introduced by the input gm stages. In a basic AFA, where there is only one input cell and one feedback cell, the formal requirement for linearity is simply that the tail currents be the same. In the case of the variable-gain amplifier according to the invention, this condition is skewed by the fact that more than one input cell is partially active at any one value of the gain. It has been empirically determined that the minimum distortion occurs when the feedback cell is operated about 0.8 times the input cell bias.

A buffer amplifier 31 is included to "auto-center" the output voltage $V_{OUT}$. This allows the amplifier to operate with a variety of power supply configurations including both single and dual supplies.

Figure 4:
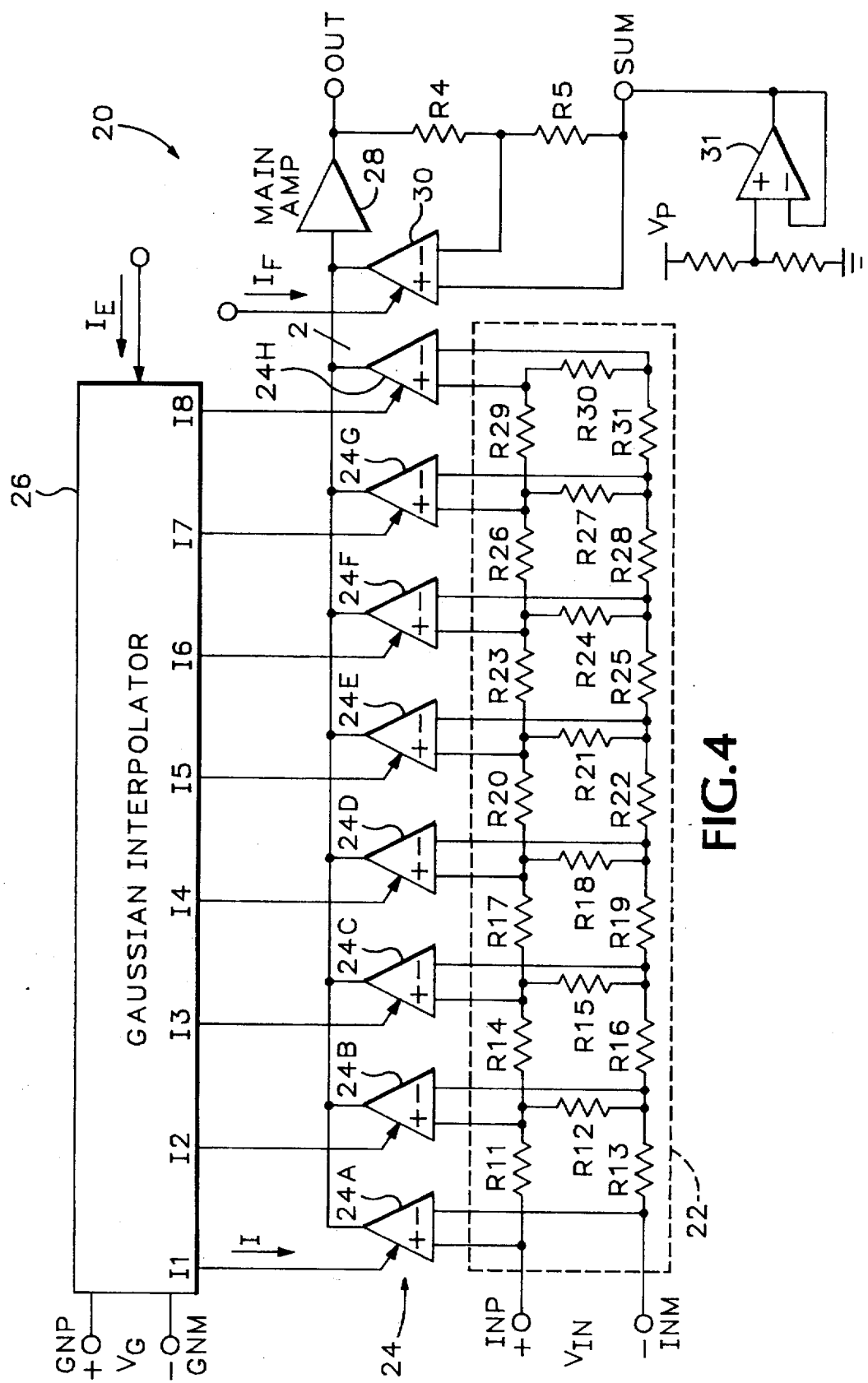
FIG. 4 is a more detailed block diagram of the variable-gain amplifier of FIG. 3 showing the design of the differential attenuator.

Referring now to FIG. 4, a more detailed block diagram of the variable-gain amplifier 20 is shown. In this diagram, the N gm stages are shown individually, where N is equal to 8. The invention is not limited to the case of N=8 but instead can be extended to fewer gm stages as well as to more. Each gm stage (e.g., 24A) includes a set of differential inputs (+,−) and a set of differential outputs. The differential outputs of each stage are coupled to the differential inputs of the main amp 28 while the differential inputs of the gm stages are coupled to a respective pair of taps of the differential attenuator 22.

The attenuator 22 is a mirror-symmetric ladder attenuator that includes (N−1) "π" attenuator sections or stages, instead of the "T" sections used in the prior art. As a result of this symmetry, the "essentially equal" base currents associated with each pair of transistors in the gm stages now flow into equal resistances, generating essentially zero offset voltages due to these currents. This was not true in the prior art.

Optimizing the attenuation per tap is important. If too low, a large number of taps (and thus, gm stages) is needed to cover a specified gain range, which is uneconomical and increases the drive voltage requirements to the interpolator. If too high, the ripple in the gain area will increase, unless other measures are taken to "smooth" the interpolator function. Pushing the ladder approach too far can lead to "rounded shoulders" at the extremities of the gain range. Another important factor is the manufacturability of the attenuator. The use of integer resistances is preferred for reasons of manufacturability. In the preferred embodiment, an R-3R-R "integer gear-ratio" is selected for each attenuator stage. This choice produces an attenuation of 6.9 dB per tap, or 48.4 dB of total attenuation. This provides an adequate amount of over- and under- range and good law conformance right up to the edges of a nominal 40 dB variable-gain range, while avoiding excessive ripple in the gain error.

Figure 5:
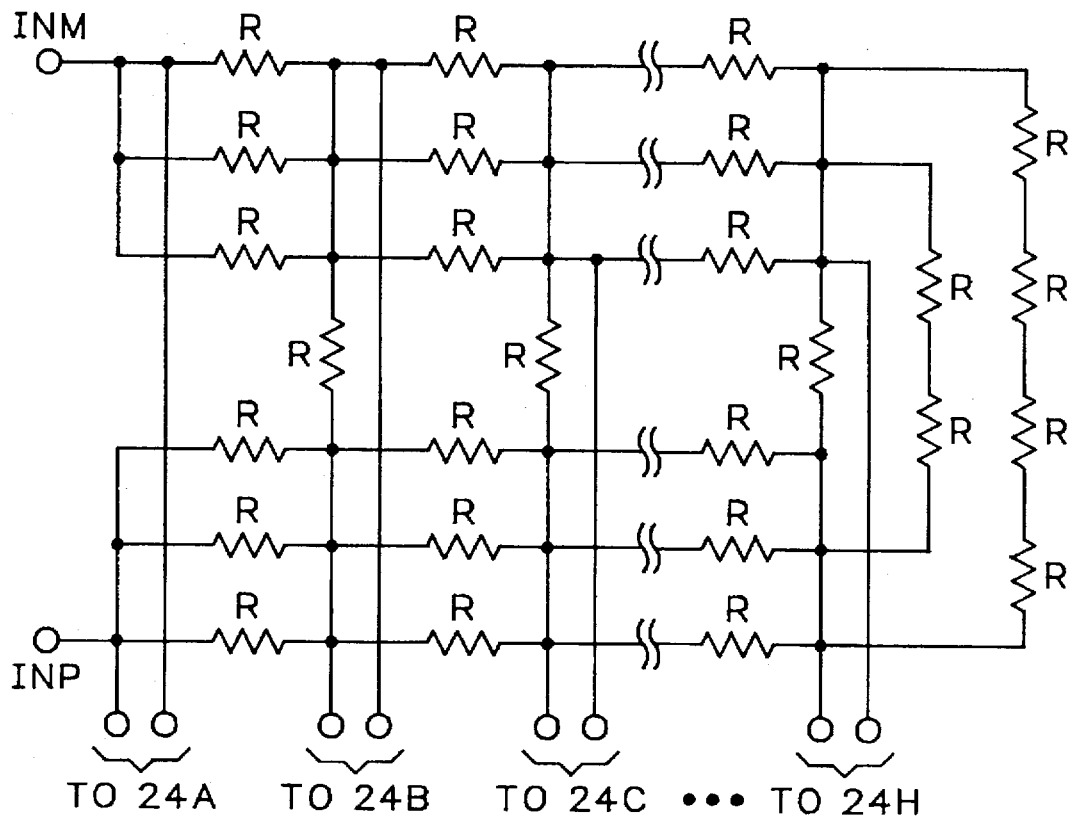
FIG. 5 is a schematic drawing of one practical embodiment of the differential attenuator of FIG. 3.

The preferred embodiment of the differential attenuator 24 is shown in FIG. 5. This attenuator is actually an R/3-R-R/3 network. If R is chosen to be 800 ohms, the input resistance is approximately 1 k ohm. It is necessary that these resistors R be physically-large in order to handle potentially high peak signal currents (thus, input power). The attenuator also includes padding resistors at the termination end, which are needed because the theoretical termination for using this network with R=800 ohms is 471.7 ohms, which cannot be realized using unit resistors. If approximated using 800 ohms in parallel with two times 800 ohms (i.e., 533.3 ohms), a further 4.08 k ohm is needed in shunt. A small empirical adjustment to this termination can yield a more accurate gain fit at the low end of the range.

Figure 6:
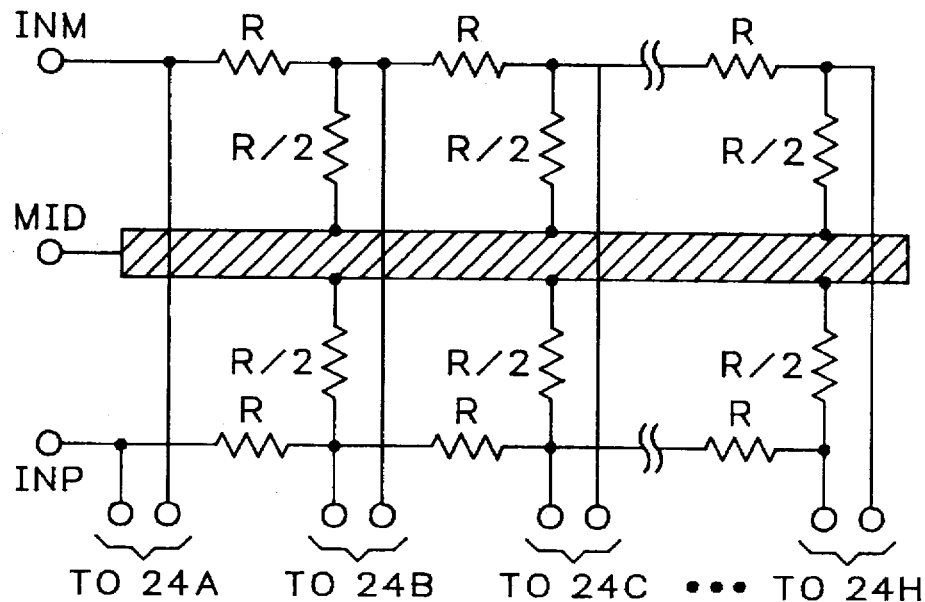
FIG. 6 is a schematic drawing of another embodiment of the differential attenuator of FIG. 3.

An alternative embodiment of the differential attenuator is shown in FIG. 6. This "center-tapped" attenuator includes a third input terminal MID to which a mid-point voltage supply is applied. This mid-point voltage eliminates current modulation due to early voltage effects on the current mirrors used in the interpolator circuit (FIG. 7) as well as bias up the N gm stages.

Figure 7:
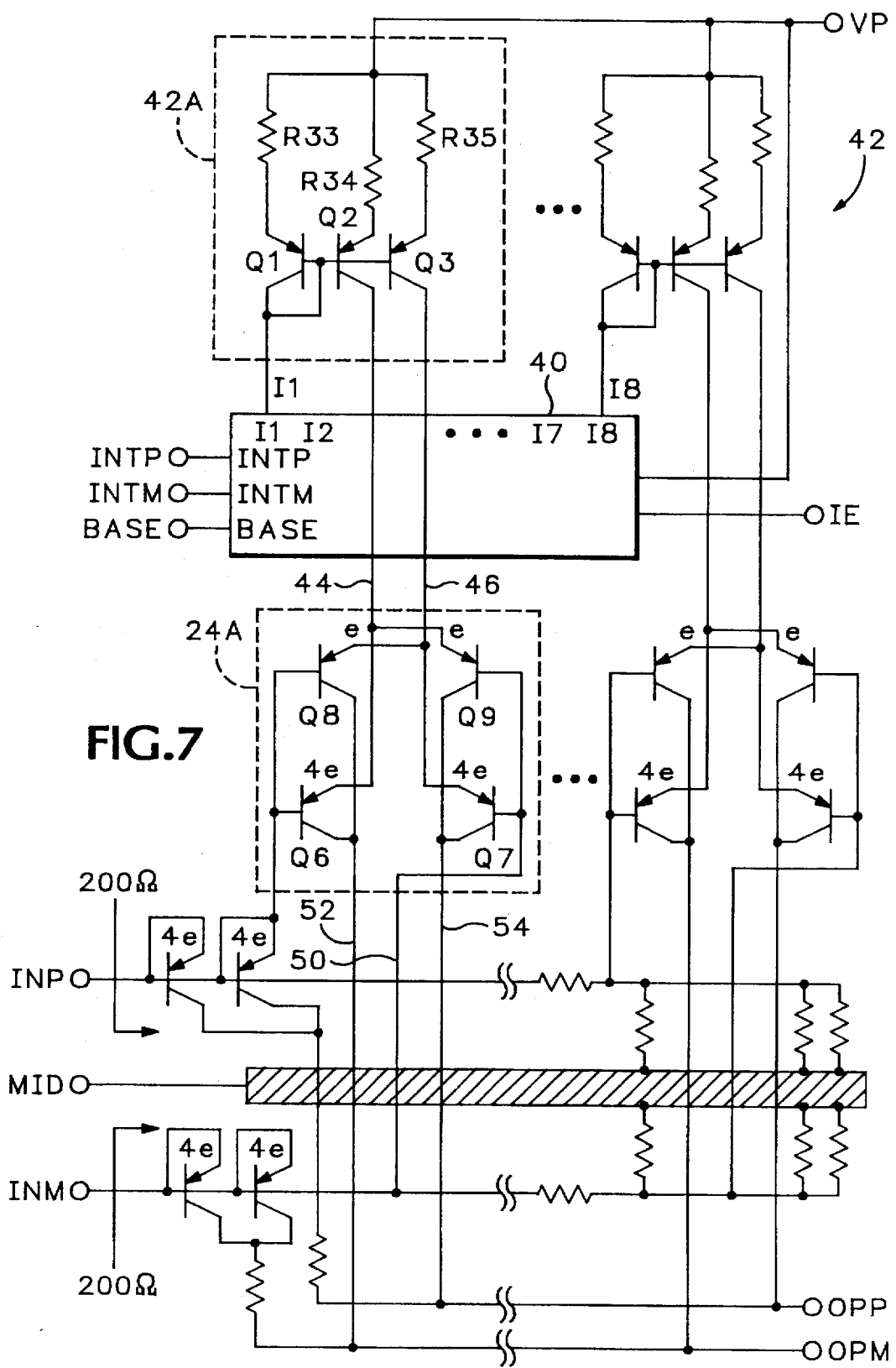
FIG. 7 is a schematic diagram of the variable-gain amplifier of FIG. 3.

Referring now to FIG. 7, a more detailed diagram of the variable-gain amplifier according to the invention is shown. The amplifier includes a Gaussian interpolator 40 and a plurality of dual current mirrors 42 is shown. The Gaussian interpolator 40 includes several inputs: control inputs INTP and INTM, a bias voltage input BASE, a supply voltage input VP, and a control current input IE through which a control current $I_E$ passes. The interpolator 40 also includes eight outputs I1–I8 to which the control current IE is steered in a sequential manner as the control signal is varied between its minimum and maximum values.

Figure 8:
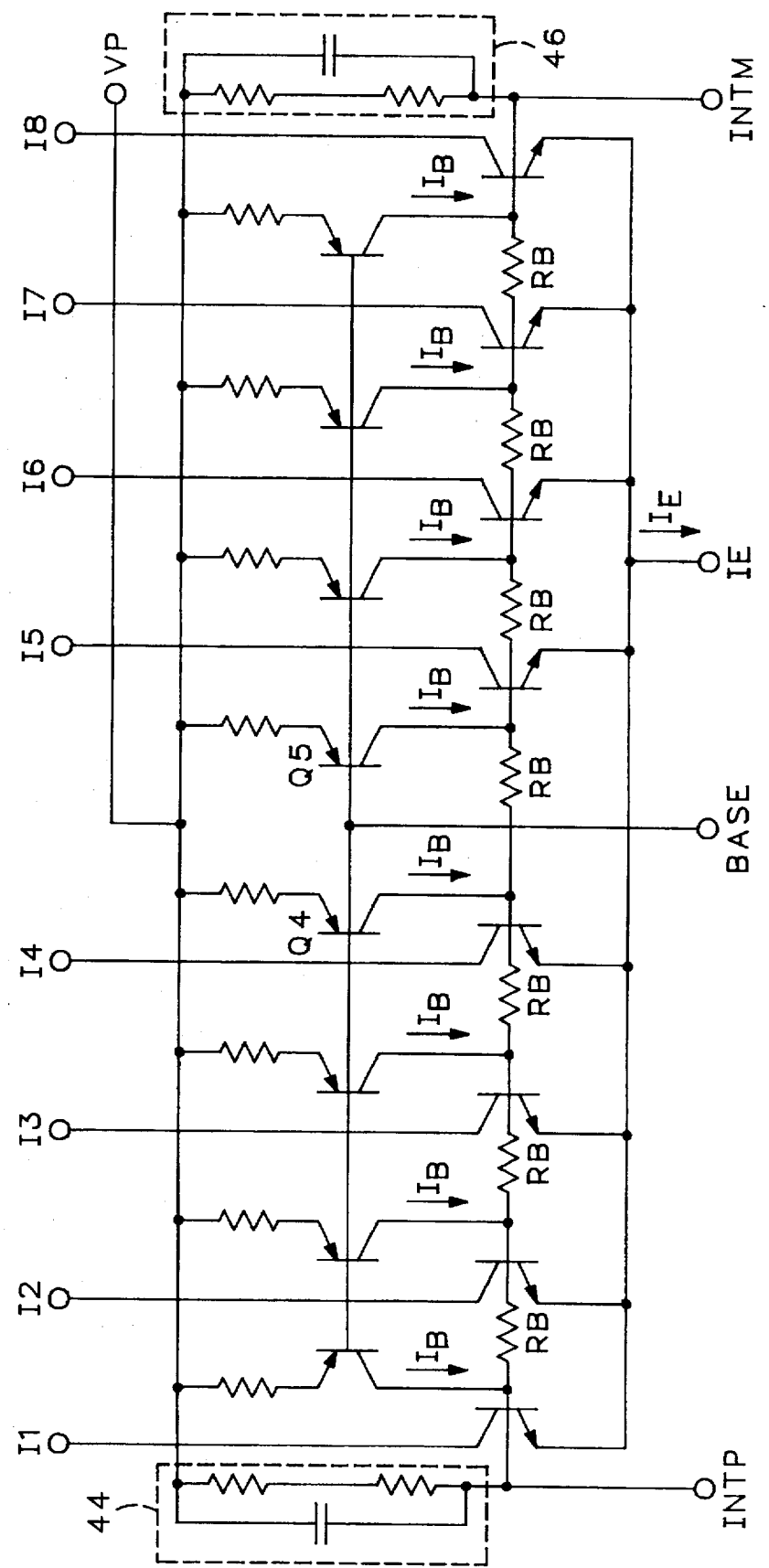
FIG. 8 is a schematic diagram of the interpolator of FIG. 7.

The preferred embodiment of the attenuator 40 is shown in FIG. 8. The Gaussian interpolator 40 shown therein is essentially that shown in U.S. Pat. No. 5,077,541. There are, however, two differences. The first is the bias input BASE connected to a center-point in the circuit. This bias input BASE is connected to the bases of each of the current source transistors in order to provide a bias voltage thereto. This bias voltage establishes the current provided by each of the current source transistors (e.g., Q4). The other difference is the addition of RC networks 44 and 46 to the signal inputs INTP and INTM, respectively. Other than that, the interpolator 40 is essentially that shown in the above-cited patent and operates in substantially the same manner. Accordingly, its operation is not further discussed.

Referring again to FIG. 7, a plurality of dual current mirrors 42 are coupled to the eight outputs of the interpolator 40. For example, a dual current mirror 42A is coupled to output $I_1$ of interpolator 40 to receive a current therefrom. This current passes through diode connected transistor Q1, which thereby creates a base-to-emitter voltage across its base-to-emitter junction. This voltage (plus the voltage drop across resistor R33) is imposed across the base-to-emitter junctions of mirror transistors Q2 and Q3, which thereby produces currents in those mirror transistors. In this way, the current through Q1 is "mirrored" to transistors Q2 and Q3. The current through mirror transistors Q2 and Q3 is not the same magnitude of that through Q1 since the emitter areas of Q2 and Q3 are not the same as that of Q1. The emitter areas of Q2 and Q3, however, need to be exactly equal so that the currents through Q2 and Q3 are exactly equal. Dual current mirrors are required because of the chosen implementation of the gm stages shown below in FIG. 7.

Each gm stage is comprised of four transistors organized as a so-called "multi-tanh" gm cell. The multi-tanh gm cells have much better inherent linearity than the simple bipolar differential pairs typically used as gm cells. The detailed explanation of the multi-tanh gm cells is given in my commonly-assigned, co-pending application entitled "Current-Controlled Quadrature Oscillator Based on Differential gm/C Cells," filed on Nov. 23, 1994, Ser. No. 08/344, 361, incorporated herein by reference. The multi-tanh cell 24A operates essentially like a simple differential pair, but with enhanced linearity. In the preferred embodiment, the emitter area ratio of Q6 to Q8 and Q7 to Q9 is equal to four to one (4:1). It is this difference in emitter areas that produces the extended linearity.

The multi-tanh gm cell 24A includes four inputs and two outputs. Two of the inputs 44 and 46 are connected to corresponding outputs 44 and 46 of the respective current mirror 42A. The current mirror 42A therefore provides the two tail currents required by the multi-tanh gm cell. Alternatively, if a simple differential pair were used for each gm cell, only a single current mirror output would be required.

The multi-tanh gm cell 24A further includes two signal inputs 48 and 50 that are connected to a pair of taps on the differential attenuator in order to receive an attenuated version of the input voltage $V_{IN}$. The outputs 52 and 54 are connected to outputs OPM and OPP, respectively, which are connected to the differential inputs of the main amplifier (FIG. 3). The other multi-tanh gm cells are similarly connected to their respective current mirror and taps on the differential attenuator.

Not shown in FIG. 7 is the main amplifier and the feedback gm stage. The fixed gm stage can be constructed similarly to the other gm stages using a multi-tanh gm cell. The tail currents to the fixed gm cell, however, do not come from the interpolator since the tail currents are fixed. Thus, fixed current sources can be used, as are known in the art.

Referring again to FIG. 8, the prior art interpolator shown in the No. '541 patent was designed for a dual supply system (i.e., ±5 volt). It is desirable, however, to operate on a single 5 volt supply, which really means from a 4.5 volt supply at the worst-case temperature. In the Gaussian interpolator, the control current $I_E$ is "steered" to one of the eight transistors by the voltages set up on the base nodes, which are the result of two effects: (1) the currents $I_B$ flowing in the resistors $R_B$ cause the base voltages $V_B(x)$, where x represents left-right position, to lie on a locus which is parabolic, being most positive inside the network and falling negatively on either side of this maximum, and having a peak amplitude of $I_B R_B/8$; (2) the voltage difference $V_{BB}$ between the ends of the resistor network alters the position of this maximum in $V_B(x)$. Due to the high transconductance of the BJT, the transistors whose bases are most positive conduct most of the $I_E$. Thus, $V_B(x)$ can be expressed in the form $-Qx^2$, where Q represents the parabolic gradient; this, together with the exponential $I_E$ minus $V_{BE}$ relationship, results in an essentially Gaussian form $\exp(-Qx^2)$ for the collector currents, except that the N transistors have a very different form because the parabolic voltage "runs off the end of the network" for these devices, which eventually conduct all of the $I_E$ for large, $V_{BB}$ over-drives.

It can be shown that, for an N-transistor network, a drive of precisely $(N-1)I_B R_B$ is required to transfer the maximum from one base node to its neighbor. Thus, to move from $Q_1$ to $Q_N$ (which entails (N-1) shifts), a drive of $(N-1)^2 I_B R_B$ is required, and in practice the peak drive is about "one unit" of $(N-1)I_B R_B$ more than that. Thus, total voltage variation of some 56 $I_B R_B$ is needed for an eight-transistor case (i.e., N=8). This drive is applied differentially so each end of the base network must move by 28 $I_B R_B$. In all cases, $I_B$ is proportional to absolute temperature (PTAT) to stabilize the gm (and thus the bandwidth) of the OP amp of which these gm cells form the input stages.

The magnitude of the voltage $I_B R_B$ determines the parabolic gradient Q. It can be shown that the gradient Q must be a certain amount of $V_T$ (that is, kT÷q) units in order to achieve well-controlled transfer of $I_E$ from one transistor to another. If Q is too high, the transfer will become abrupt and the final gain function will show a large deviation (ripple) from the ideal linear-in-dB law; if too low, the gain error will be "soft" and have "shoulders" at the extremities of the range.

The voltage required to fully drive the Gaussian interpolator of the No. '541 patent (which is a linear replication of the gain-control voltage $V_G$) is stable with current, in order to ensure that the overall gain-scaling was stable. Thus, the currents $I_B$ were derived from a temperature-stable voltage source. Thus, for an $I_B R_B$ equal to 140 millivolts, the required full-scale drive voltage is 28×140 millivolts=3.92 volts at each end of the network (~8 V total), independent of temperature. This was not a significant challenge in the dual supply environment of the prior art. If a single supply is used, however, achieving this drive voltage is significantly more difficult. Accordingly, it is desirable to lower the required drive to the network.

The interpolator according to the invention achieves this in several ways. First note that the parameter Q can be expressed as $I_B R_B/2V_T$. Thus, if $I_B$ is fixed, Q is unavoidably a function of temperature. Therefore, when the temperature is low, Q is high and the gain function will show a large ripple; when the temperature is high, Q is low and the gain function will be "soft" at the extremities of the range. This is exactly what happens in the Gaussian interpolator of the No. '541 patent. For example, if Q is lowered below its design value of 2.6 at T=27° C. (in an attempt to lower the full-scale drive voltage), the gain error at T=–55° C. becomes very rounded.

This problem has been solved in the interpolator according to the invention by the use of a proportional-to-absolute temperature (PTAT) current for $I_B$. Now, because Q is constant over the full temperature range, its nominal value can be lowered considerably. The desired response to the gain-control input voltage $V_G$, however, should have a near –0 temperature coefficient. In order to achieve this desired result, the gain-control input voltage $V_G$ is converted from a temperature-stable (customer-supplied) voltage to an internal PTAT voltage, $V_{BB}$, to drive the interpolator. The invention uses a special two-quadrant multiplier to perform this conversion.

Figure 9:
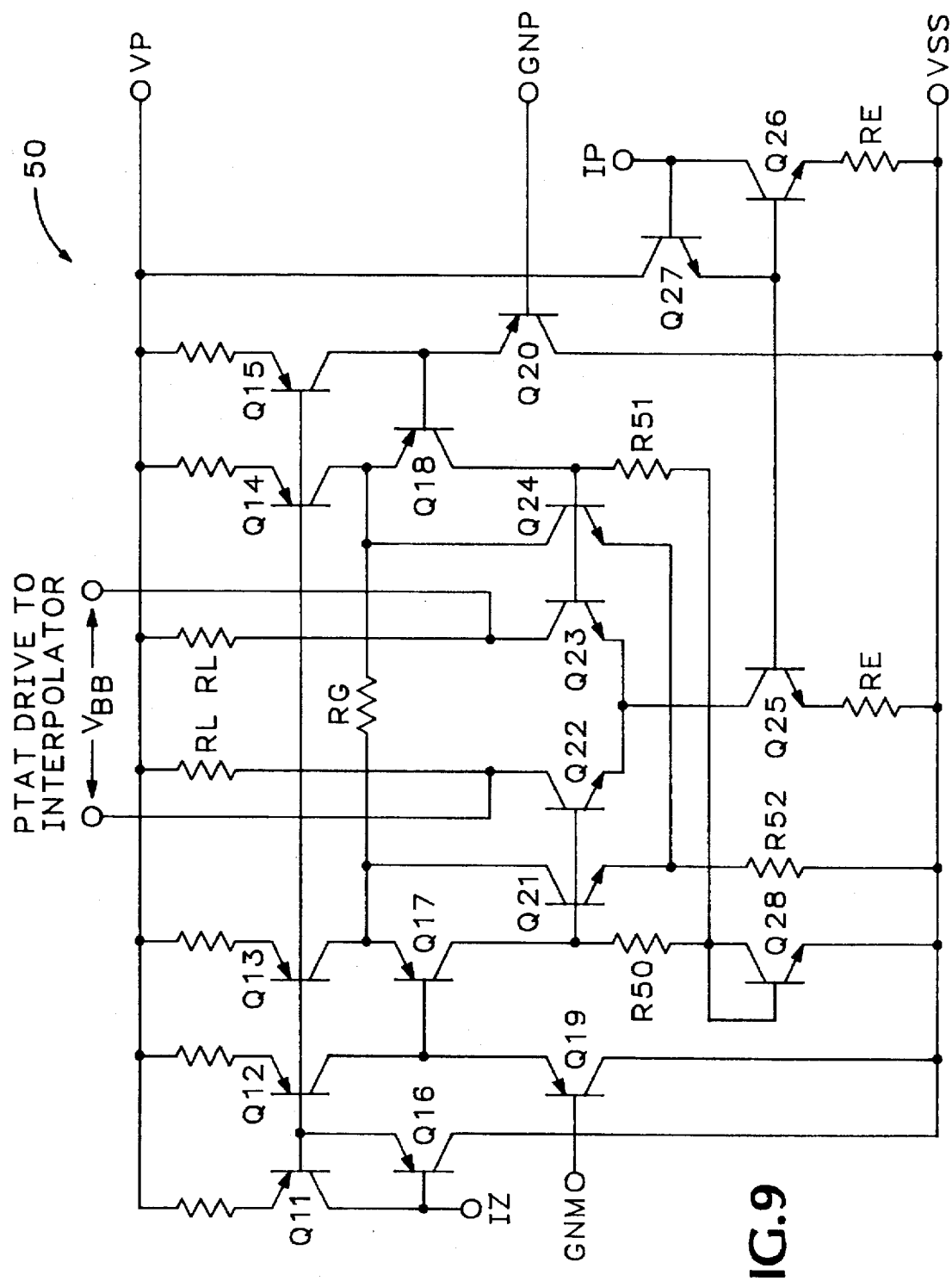
FIG. 9 is a schematic of a two-quadrant multiplier used to convert the temperature stable gain-control voltage $V_G$ to a proportional to absolute temperature (PTAT) voltage $V_{BB}$ that drives the interpolator of FIG. 3.

Referring now to FIG. 9, a schematic of a two-quadrant multiplier is shown. The multiplier 50 converts the temperature-stable gain-control voltage $V_G$ applied to the differential input terminals GNP and GNM to a voltage proportional to $V_G$, but which is also proportional to absolute temperature (PTAT). This PTAT voltage $V_{BB}$ appears across the load resistors $R_L$ and drives the interpolator network shown in FIG. 8. The multiplier 50 then is interposed between the differential input terminals GNP and GNM and the gain-control inputs of the interpolator.

The PTAT form of the output voltage $V_{BB}$ occurs because a bias current $I_P$ provided to input terminal IP is also PTAT. A temperature-stable bias current $I_Z$, on the other hand, it provided to input terminal IZ. The multiplier 50 then multiplies these two currents to produce the voltage $V_{BB}$, which has the following relationship:

$$V_{BB}=V_G\times(I_P/I_R)$$

where $V_G$ is the gain control voltage applied across inputs GNP and GNM.

The multiplier 50 includes a classical translinear multiplier core comprised of transistors Q21, Q22, Q23 and Q24. The currents in transistors Q21 and Q24 are determined by the (temperature-stable) currents supplied by transistors Q13 and Q14 and the voltage imposed across resistor $R_G$, the gain-setting resistor, by the input $V_G=V_{GNP}-V_{GNM}$. The transfer of $V_G$ to $R_G$ is rendered linear by operation of transistors Q17 and Q18 at essentially constant currents, supplied by the two resistors R50 and R51, which are in turn determined by a stable voltage generated across resistor R52 in the common emitter branch of transistors Q21 and Q24. Transistors Q19 and Q20 are emitter-followers which serve to raise the input impedance and also perform level-shifting. The current ratios in Q21 and Q24 are replicated in Q22 and Q23, but their outputs are also PTAT. The voltages at the collectors of these transistors can swing from the supply rail VP to within about one volt above the other rail VSS, providing the needed large swing for the interpolator network when the total supply is only 4.5 volts. Moreover, by using unequal currents in transistors Q13 and Q14, the range of $V_G$ is offset so that when GNM is grounded, the required range of $V_G$ runs from about +0.1 volts to +1.25 volts.

Figure 10:
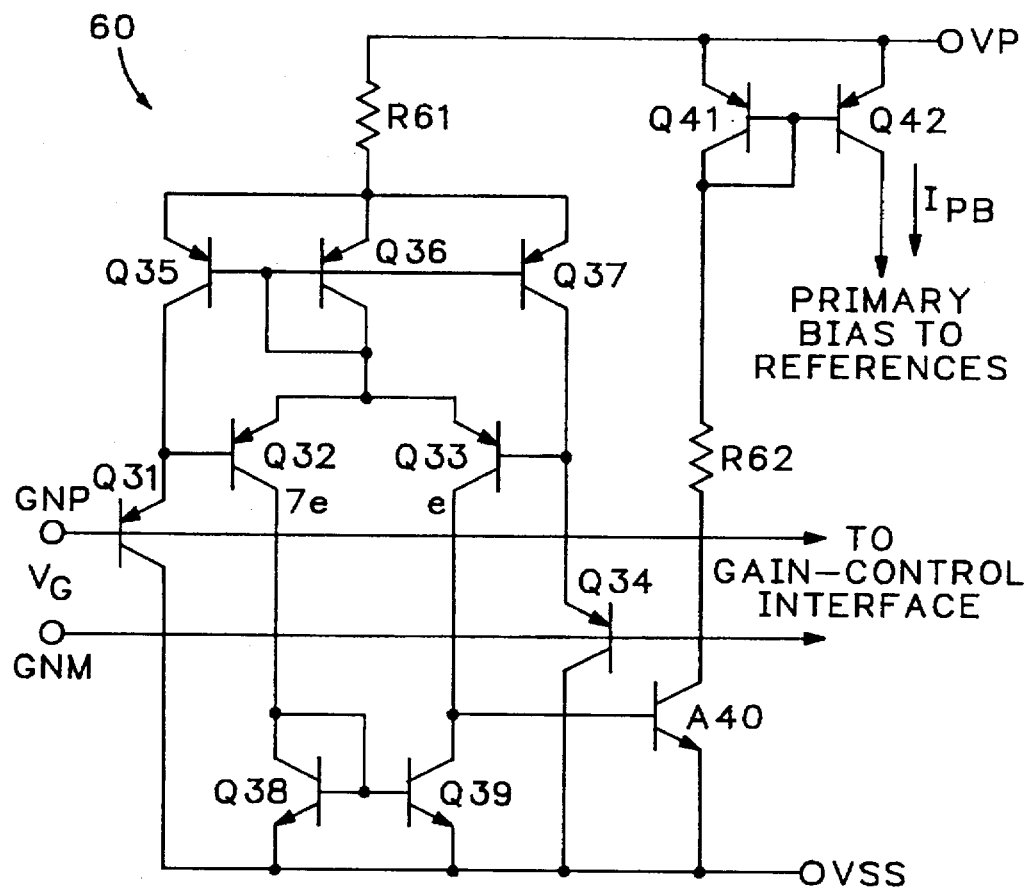
FIG. 10 is a schematic diagram of a power enable cell which removes power from the variable-gain amplifier if the gain-control voltage $V_G$ is less than a predetermined threshold.

Yet another aspect of the invention is shown in FIG. 10. The variable-gain amplifier according to the invention is envisioned for applications requiring minimum power consumption. In these applications, it is desirable to reduce or eliminate the power consumption of the device when not in use. Many components have a dedicated pin for this purpose. This approach, however, can require a larger package and thus increase the cost of the component. The approach taken in the present invention, in contrast, uses the gain-control inputs to shut down the power consumption of the amplifier when the gain-control voltage $V_G$ is less than a predetermined threshold. In a preferred embodiment, this threshold is approximately 50 millivolts.

The basic gain-scaling for the variable gain amplifier according to the invention is 40 dB/V, so the differential input voltage $V_G$ must change by 1.15 V to sweep the central 46 db. This is offset in the preferred embodiments so the gain is controlled by an input of $0.1 \text{ V} \leq V_G \leq 1.25 \text{ V}$. In most cases, input GNM will be grounded and the required voltage provided by a single-supply digital-to-analog converter (DAC). The maximum input of 1.25 V is well within the capabilities of an inexpensive DAC operating on a 5 volt supply. If necessary, higher control voltages can be used with the inclusion of a simple resistor divider.

The power control cell 60 establishes the desired threshold voltage by scaling the emitter area of transistor Q32 with respect to that of Q33. In the preferred embodiment, the emitter area ratio of Q32 to Q33 is 7:1. This produces a predetermined threshold voltage of 50 millivolts. When the gain control voltage $V_G$ is less than this threshold, the gain control cell 60 disables a primary bias current $I_{PB}$ provided by current mirror transistor Q42. This current is to turn a PTAT bias cell on-and-off. Thus, by disabling the primary bias current $I_{PB}$ the power control cell 60 effectively eliminates any power consumption by the variable gain amplifier.

Figure 11:
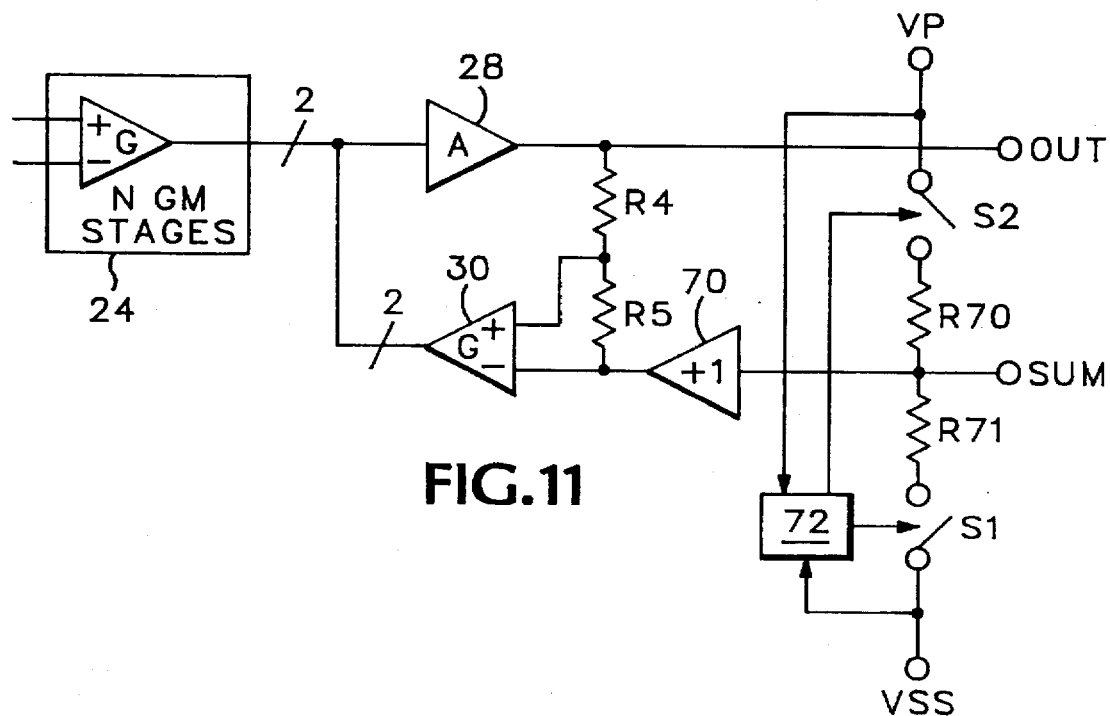
FIG. 11 is a block diagram of a dual mode version of the variable-gain amplifier according to the invention, which operates with both a single supply voltage and dual supply voltages.

Another embodiment of the invention is shown in FIG. 11. This version includes a voltage buffer 70 interposed between the sum and the non-inverting input of the feedback gm cell 30. Note that the differential attenuator 22 and the interpolator 26 are not shown to simplify the drawing. They are connected, however, in the same way as shown in FIG. 3. The voltage buffer is a simple wide-band voltage-follower. An additional pair of gain setting resistors R70 and R71 are coupled to the SUM pin. The addition of these two resistors allows the gain of the amplifier to be increased. The gain of the amplifier can then be expressed as follows:

$$\text{GAIN} = \frac{(R4+R5)}{R5} \times \frac{(R70+R71)}{R71}$$

In the preferred embodiment, these resistors R70 and R71 are external to the variable gain amplifier, which is formed in a monolithic circuit.

A first switch S1 is interposed between resistor R71 and the supply voltage terminal VNG. Similarly, second switch S2 is connected between resistor R70 and supply voltage VPS. The switches open the circuit formed between the resistors and the supply voltages under certain conditions. These conditions are detected by a detection circuit 72. The detection circuit 72 opens the switches when either one of two conditions are present: (1) when the supply voltage is less than 7.5; and (2) when the amplifier is powered down (i.e., $V_G$ is less than or equal to 50 millivolts). The first condition allows the output voltage to be centered to the mid-point of the supply in a single supply application, while presenting a high impedance in a dual supply system. The second eliminates any power consumption due to the resistors R70 and R71 when the amplifier is shut-down. This allows the circuit to be used in both single and dual supply applications while consuming the least amount of quiescent power.

A new type of variable gain amplifier has been disclosed herein. This amplifier has several advantages over previous designs. In particular, the input is now differential and presents an essentially constant floating resistance. There is also significantly less output offset ripple. The amplifier powers down when the gain control voltage is less than a predetermined voltage without requiring a dedicated input pin for this function. It also automatically centers the output to the mid-point of the supply in single-supply applications, while freeing the relevant pin (SUM) to a high-impedance when using dual supplies.

Having described and illustrated the principles of the invention in a preferred embodiment thereof, it should be apparent that the invention can be modified in arrangement and detail without departing from such principles. I claim all modifications and variation coming within the spirit and scope of the following claims:

1. A variable-gain amplifier comprising:
   an attenuator including a pair of differential attenuator inputs to receive a differential input signal and having a series of differential attenuator outputs to produce progressively attenuated differential signals;
   a plurality of transconductance (gm) stages each having a differential input coupled to one of said differential attenuator outputs, a bias input for receiving a respective bias signal, and an output;
   an interpolator including first and second gain-control inputs for receiving an analog control signal and a plurality of gain-control outputs, each gain-control output coupled to a respective bias input of a transconductance stage for supplying a respective bias signal thereto;
   an output amplifier having an amplifier input coupled to the output of each transconductance stage and having an amplifier output for providing a variable-gain amplifier output signal; and
   a feedback stage coupled between the output of said output amplifier and the input of the amplifier.

2. A variable-gain amplifier according to claim 1 wherein the attenuator includes a symmetrical ladder network.

3. A variable-gain amplifier according to claim 2 wherein the attenuator includes a π impedance network having a plurality of network impedance stages coupled in series, each impedance stage including:
   a first resistor coupled to the first gain-control input;
   a second resistor coupled to the second gain-control input;
   a third resistor coupled between the first resistor and a common node that receives a sub-rail voltage supply; and
   a fourth resistor coupled between the second resistor and the common node.

4. A variable-gain amplifier according to claim 2 wherein the attenuator includes a symmetrical π impedance network having a plurality of network impedance stages coupled in series, each impedance stage comprised of a first resistor coupled to the first gain-control input, a second resistor coupled to the second gain-control input, and a third resistor coupled between the first and second resistor.

5. A variable-gain amplifier according to claim 3 wherein the resistance of the first resistor includes a resistance R, the third resistor a resistance of 3 R, and the second resistor a resistance of R.

6. A variable-gain amplifier according to claim 1 wherein the attenuator includes a center-tap for receiving a sub-rail voltage.

7. A variable-gain amplifier according to claim 1 wherein the interpolator comprises a Gaussian interpolator including:

a plurality of transistors arranged in a sequential manner from a first transistor to a last transistor, each transistor having a collector, a base, and an emitter, the base of the first transistor forming a first gain-control input and the base of the last transistor forming a second gain-control input, wherein the analog control signal is received across the first and second gain-control inputs, the collectors of each transistor forming a respective gain-control output;

a plurality of base resistors, each base resistor coupled between the bases of two adjacent transistors; and a plurality of bias current sources, each bias current source coupled to the base of a respective transistor and coupled to two base resistors connected to the base of the respective transistor.

8. A variable-gain amplifier according to claim 7 wherein the interpolator further includes a plurality of current mirrors, each current mirror interposed between the collector of a respective transistor and the bias input of the transconductance stage coupled thereto.

9. A variable-gain amplifier according to claim 8 wherein the plurality of transistors are NPN bipolar transistors and the current mirrors are comprised of PNP transistors.

10. A variable-gain amplifier according to claim 7 wherein a constant current is steered to the emitter of each transistor in a sequential manner as the analog control signal is swept across its signal range.

11. A variable-gain amplifier according to claim 7 wherein the bias current sources each produce a bias current that is proportional-to-absolute-temperature (PTAT).

12. A variable-gain amplifier according to claim 1 wherein the analog control signal is proportional-to-absolute-temperature (PTAT).

13. A variable-gain amplifier according to claim 12 further comprising a two quadrant analog multiplier coupled to having a first input for receiving a temperature-stable gain-control voltage ($V_G$), a second input for receiving a proportional-to-absolute-temperature (PTAT) current ($I_P$), a third input for receiving a temperature-stable reference current ($I_R$), and an output coupled to the first and second gain control inputs of the interpolator for producing the analog control signal ($V_{BB}$) that is proportional-to-absolute-temperature (PTAT) having the following relationship: $V_{BB}=V_G\times(I_T/I_R)$.

14. A variable-gain amplifier according to claim 1 further comprising a power-enable cell having a first input coupled to the first gain-control input and a second input coupled to the second gain-control input for receiving the gain-control signal, the power-enable cell being coupled to the output amplifier and the interpolator to remove power therefrom if the gain-control signal is below a predetermined threshold.

15. A variable-gain amplifier according to claim 1 wherein the feedback stage comprises:

a feedback transconductance stage (gm) having a differential input, and a differential output, said differential output coupled to the amplifier input of the output amplifier; and a feedback attenuator coupled between the output of the output amplifier and the differential input of the feedback transconductance stage.

16. A differential input, variable-gain amplifier comprising:

a gain-control input terminal for receiving an analog gain-control signal;

a pair of differential input terminals for receiving a differential input signal;

a first supply voltage terminal for receiving a first supply voltage;

a second supply voltage terminal for receiving a second supply voltage;

an output terminal; and an active feedback amplifier comprising:

a differential attenuator including a pair of differential attenuator inputs coupled to the pair of differential input terminals to receive the differential input signal;

a transconductance (gm) amplifier coupled to the differential attenuator;

a gain-control interface having a gain-control input coupled to the gain-control input terminal to receive the analog gain-control signal;

means for continuously varying the gain of the variable-gain amplifier responsive to the analog gain-control signal;

an output amplifier having a differential input coupled to the transconductance amplifier and having an amplifier output coupled to the output terminal for providing the amplifier output signal; and a feedback network coupled between the output of said output amplifier and the differential input thereof.

17. A differential input, variable-gain amplifier comprising:

a gain-control input terminal for receiving a gain-control signal;

a pair of differential input terminals for receiving a differential input signal;

a first supply voltage terminal for receiving a first supply voltage;

a second supply voltage terminal for receiving a second supply voltage;

an output terminal: and an active feedback amplifier comprising:

a differential attenuator including a pair of differential attenuator inputs coupled to the pair of differential input terminals to receive the differential input signal;

a transconductance (gm) amplifier coupled to the differential attenuator:

a gain-control interface having a gain-control input coupled to the gain-control input terminal to receive the gain-control signal;

an output amplifier having a differential input coupled to the transconductance amplifier and having an amplifier output coupled to the output terminal for providing the amplifier output signal; and a feedback network coupled between the output of said output amplifier and the differential input thereof, the feedback network including:

a sum terminal;

a feedback amplifier having first and second differential inputs and a differential output, the second differential input coupled to the sum terminal;

a first resistor connected between the output of the output amplifier and one of the differential inputs of the feedback amplifier; and a second resistor connected between the first and second differential inputs of the feedback amplifier.

18. A differential input, variable-gain amplifier according to claim 17 wherein the feedback network includes a voltage buffer interposed between the sum terminal and the second differential input of the feedback amplifier.

19. A differential input, variable-gain amplifier according to claim 18 further comprising:

a third resistor coupled between the first supply voltage terminal and the sum terminal; and a fourth resistor coupled between the second supply voltage terminal and the sum terminal, the third and fourth resistors forming a resistor divider network between the two supply voltages for centering the amplifier output signal.

20. A differential input, variable-gain amplifier according to claim 19 further comprising:

a first switch coupled in series with the third resistor between the sum terminal and the first supply voltage terminal; and a second switch coupled in series with the fourth resistor between the sum terminal and the second supply voltage terminal, wherein the first and second switches are normally open and close responsive to the first supply voltage being above a predetermined voltage.

* * * * *

UNITED STATES PATENT AND TRADEMARK OFFICE
CERTIFICATE OF CORRECTION

PATENT NO. : 5,684,431  
DATED : November 4, 1997  
INVENTOR(S) : Barrie Gilbert, Eberhard Brunner Page 1 of 1

It is certified that error appears in the above-identified patent and that said Letters Patent is hereby corrected as shown below:

Column 7,  
Line 46, "that is, kT + q" should be -- that is, Kt ÷ q --

Column 9,  
Line 14, "46 db" should be -- 46 dB --  
Line 15, "0.1 V ≤VG ≤1.25 V." should be -- 0.1 V ≤VG ≤1.25 V. --

Column 11,  
Line 41, "gain control inputs" should be -- gain-control inputs --

Column 12,  
Line 36, "an output terminal: and" should be -- an output terminal; and --  
Line 43, "attenuator;" should be -- attenuator: --

Signed and Sealed this

Twenty-seventh Day of November, 2001

Attest:

NICHOLAS P. GODICI  
*Attesting Officer*     *Acting Director of the United States Patent and Trademark Office*